US005894419A

United States Patent [19]
Galambos et al.

[11] Patent Number: 5,894,419
[45] Date of Patent: Apr. 13, 1999

[54] SYSTEM AND METHOD FOR ROBUST CLOCKING SCHEMES FOR LOGIC CIRCUITS

[75] Inventors: Tiberiu Carol Galambos, Haifa, Israel; Robert Paul Masleid, Austin, Tex.; Israel Abraham Wagner, Haifa, Israel

[73] Assignee: International Business Machines Corporation, Armonk, N.Y.

[21] Appl. No.: 08/845,112

[22] Filed: Apr. 21, 1997

[51] Int. Cl.$^6$ .................................................. G06F 17/50
[52] U.S. Cl. ........................................ 364/488; 364/489
[58] Field of Search ................................... 364/488, 489, 364/490, 491, 578; 395/555, 556, 558

[56] References Cited

U.S. PATENT DOCUMENTS

| | | | |
|---|---|---|---|
| 5,461,576 | 10/1995 | Tsay et al. | 364/490 |
| 5,644,499 | 7/1997 | Ishii | 364/489 |
| 5,663,888 | 9/1997 | Chakradhar | 364/489 |
| 5,740,347 | 4/1998 | Avidan | 395/183.09 |
| 5,764,951 | 6/1998 | Ly et al. | 395/500 |
| 5,774,370 | 6/1998 | Giomi | 364/489 |

Primary Examiner—Kevin J. Teska
Assistant Examiner—Leigh Marie Garbowski
Attorney, Agent, or Firm—Sawyer & Associates; Anthony V.S. England

[57] ABSTRACT

A system and method according to the present invention for mapping a clocking scheme to determine robust clocking schemes in a logic circuit is disclosed. The circuit can be represented by a clocking graph, the clocking graph having at least one loop including a plurality of vertices, wherein two vertices represent each relevant signal, one for a rising edge and one for a falling edge. Additionally, a plurality of constraints of the logic circuit propagate through circuit delays. The method according to the present invention comprises the steps of selecting one of the vertices as a reference; assigning at least one of the plurality of vertices as an unknown; creating at least a first equation by setting the unknown as not equal to any of the other vertices for each constraint, the first equation being included in a set of equations; creating at least a second equation by setting a sum of times between edges equal to a number of phases in a cycle, the second equation representing the at least one loop in the clocking graph, wherein the second equation is also included in the set of equations; and solving the set of equations to provide a set of clocking schemes.

7 Claims, 5 Drawing Sheets

SYSTEM AND METHOD FOR ROBUST CLOCKING SCHEMES FOR LOGIC CIRCUITS

FIELD OF THE INVENTION

The present invention relates to a system and method for a robust clocking scheme in a logic circuit, and more particularly, to a method for deciding which clock signal to receive when using multiple phase clocks in a logic circuit.

BACKGROUND OF THE INVENTION

Dynamic logic circuits are typically preferred when fast circuits are required. A type of dynamic logic circuit is the domino logic circuit. Domino logic circuits typically utilize a clocking scheme to determine how to transfer from one phase to another. The term "clocking scheme" for a given gate denotes the assignment of the phases for each of the pins of the gate (inputs, clock and output). It is desirable to use only those clocking schemes that have the property of correcting any timing problems of the circuit by reducing the clock frequency. Such clocking schemes are typically referred to as robust clocking schemes.

There are typically two types of domino logic circuits. The first is a footed domino logic, in which each domino has an added N-type device whose function is to prevent short circuit in the device during a pre-charge phase. The other type of domino logic circuit does not require a foot device.

The footed domino logic typically utilizes two-phased clocking systems. In order to transfer from the first phase into the second phase, information can be passed along in various ways. One way is to have overlapping clock signals. However, it is typically very difficult to generate a set of overlapping clock signals. Another conventional method for transferring from the first phase into the second phase is to utilize a special gate which includes a latch as a storing element which allows transfer of information from the first phase to the second phase. However, this latch method typically suffers from poor performance. Chips utilizing this latch system are robust in that timing problems improve when the clock frequency is slowed down.

A problem with the footed domino logic circuit is that the foot device typically causes serious performance penalties.

The other type of domino logic circuit utilizes a clock with multiple phases. This type of domino logic is referred to as a delayed reset domino circuit. The delayed reset domino circuit does not require a foot device. This type of domino logic circuit can attain increased performance and allows switching from one phase to another without the need for latches. One problem associated with such a circuit utilizing multiphase clocks, is that when a multiple number of clock signals are utilized (at least three), the system needs to determine which combination of clock signals to use for each gate since the output of each domino gate depends on which clock signal it receives. For example, the system may need to determine which combination of twelve clock signals, of which there may be several hundred possibilities, are worth considering. Systematically eliminating each possibility can drastically reduce design productivity.

What is needed is a method for robust clocking schemes in a dynamic circuit which improves design productivity. The present invention addresses such a need.

SUMMARY OF THE INVENTION

A system and method according to the present invention for mapping a clocking scheme to determine robust clocking schemes in a logic circuit is disclosed. Preferably, in a method according to the present invention, all possible clocking schemes are mapped and robust clocking schemes determined in a logic circuit. The circuit can be represented by a clocking graph, the clocking graph having at least one loop including a plurality of vertices, wherein two vertices represent each relevant signal, one for a rising edge and one for a falling edge. Additionally, a plurality of constraints of the logic circuit propagate through circuit delays. The method according to the present invention comprises the steps of selecting one of the vertices as a reference; assigning at least one of the plurality of vertices as an unknown; creating at least a first equation by setting the unknown as not equal to any of the other vertices for each constraint, the first equation being included in a set of equations; creating at least a second equation by setting a sum of times between edges equal to a number of phases in a cycle, the second equation representing the at least one loop in the clocking graph, wherein the second equation is also included in the set of equations; and solving the set of equations to provide a set of clocking schemes.

DESCRIPTION OF THE INVENTION

The present invention relates to a method for finding robust clocking schemes for a logic circuit such as a domino logic circuit. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown but is to be accorded the widest scope consistent with the principles and features described herein.

Figure 1:
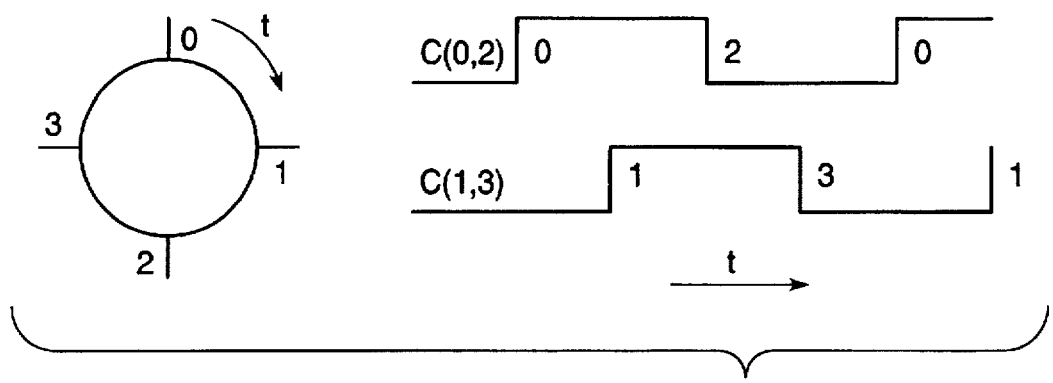
FIG. 1 shows various clock signals of a four phase clock system.

FIG. 1 shows an example of a typical domino logic circuit signal waveforms. The clock signal waveforms shown in FIG. 1 are two fundamental clock waveforms which can be distributed to all essential locations within the circuit. These two fundamental clock waveforms can generate up to 12 different waveforms, which can be used by a domino gate.

This example shows a four (n) phase ripple domino circuit which is typically used for implementing high speed VLSI.

As shown in FIG. 1, there are four (n) clock edges that are distributed within the waveforms. These clock edges are signified in FIG. 1 as 0, 1, 2, and 3 (n−1). Given these four (N) clock edges, there are twelve (n*(N−1)) possible clock phases available, each clock phase being defined by an ordered couple of distinct edges. For example, c(0,2) denotes a clock phase having the rising edge 0 and the falling edge 2. The four edges repeat themselves in a cyclic fashion. The time between two edges are defined as t(a,b)= (b−a)mod4. As shown in FIG. 1, t(a,b) can be viewed as the number of 1/N cycles in this example, quarter cycles, passed from a to b in the clockwise direction.

As previously discussed, the term "clocking scheme" for a given gate denotes the assignment of the phases for each of the pins of the gate (inputs, clock and output). It is desirable to use only those clocking schemes that have the property of correcting any timing problems of the circuit by reducing the clock frequency. Such clocking schemes are typically referred to as robust clocking schemes.

There are typically two types of domino logic circuits. The first is a footed domino logic, in which each domino has an added N-type device whose function is to prevent short circuit in the circuit during a pre-charge phase. The other type of domino logic circuit is the delayed reset domino circuit which does not require a foot device.

The footed domino logic typically utilizes two-phased clocking systems. In order to transfer from the first phase into the second phase, information can be passed along in various ways. One way is to have overlapping clock signals. However, it is typically very difficult to generate a set of overlapping clock signals. Another conventional method for transferring from the first phase into the second phase is to utilize a special gate which includes a latch as a storing element which allows transfer of information from the first phase to the second phase. However, this latch method typically suffers from poor performance. Chips utilizing this latch system are robust in that timing problems improve when slowing the clock frequency.

Figure 2:
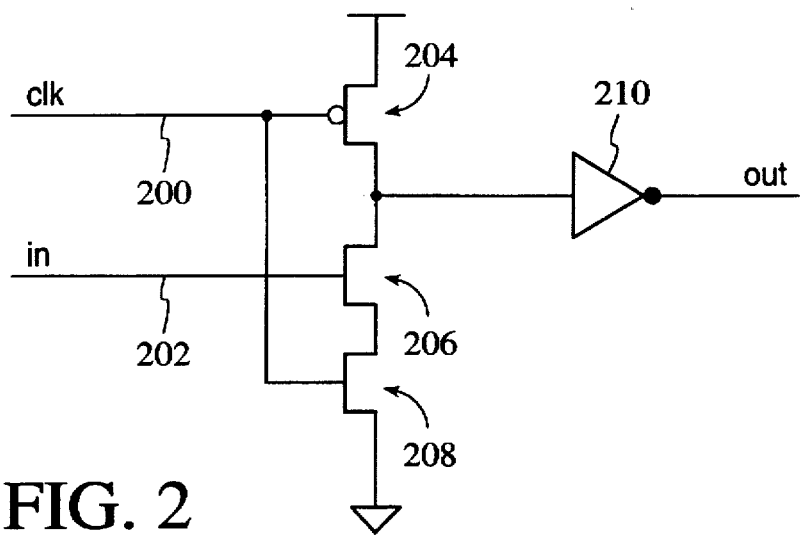
FIG. 2 is a schematic diagram of a basic footed domino gate.

FIG. 2 is a schematic diagram of the basic footed domino gate. The gate includes a clock signal 200, an in signal 202, a p-type transistor 204, a logic performing transistor 206, a foot device 208, and an output inverter 210. The p-type transistor 204 provides precharge. The logic performing transistor 206 normally is a more complicated network, however, only one transistor is shown for simplicity. The purpose of the foot device 208 is to prevent having a short circuit current during a precharge phase.

Figure 3:
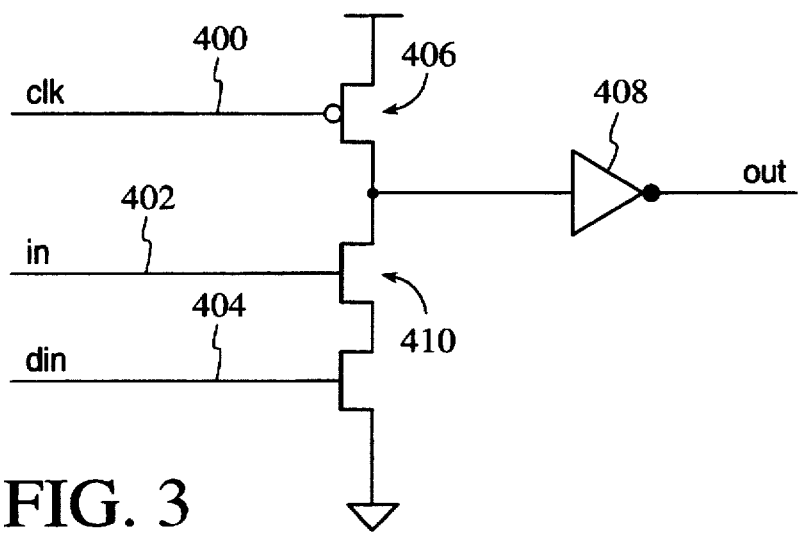
FIG. 3 is a schematic diagram of a basic delayed reset domino gate.

FIG. 3 is a schematic diagram of a basic delayed reset domino circuit. As previously discussed, the delayed reset domino circuit does not require a foot device. This type of domino logic circuit can attain increased performance. One problem associated with such a circuit utilizing multiphase clocks, is that when a multiple number of clock signals are utilized (at least three), the designer needs to determine which combination of clock signals to use for each gate since the output of each domino gate depends on which clock signal it receives. For example, the system may need to determine which combination of twelve clock signals, of which there may be several hundred possibilities, are worth considering. Systematically eliminating each possibility can drastically reduce design productivity.

The delayed reset domino gate of FIG. 3 includes a clock signal 400, an input signal 402, a dominant input 404, a P-transistor 406 for providing precharge, an output inverter 408, and a logic performing transistor 410.

When domino gates are utilized without foot devices, as is the case for the basic delayed reset domino gate of FIG. 3, then a set of inputs called dominant inputs are defined which have properties that prevent short circuit currents during a precharge phase. The purpose of the dominant input 404 is to participate in the logic function of the gate and also to prevent short circuit currents.

What is needed is a method for finding robust clocking schemes in a dynamic circuit which improves design productivity. The present invention addresses such a need.

Figure 4:
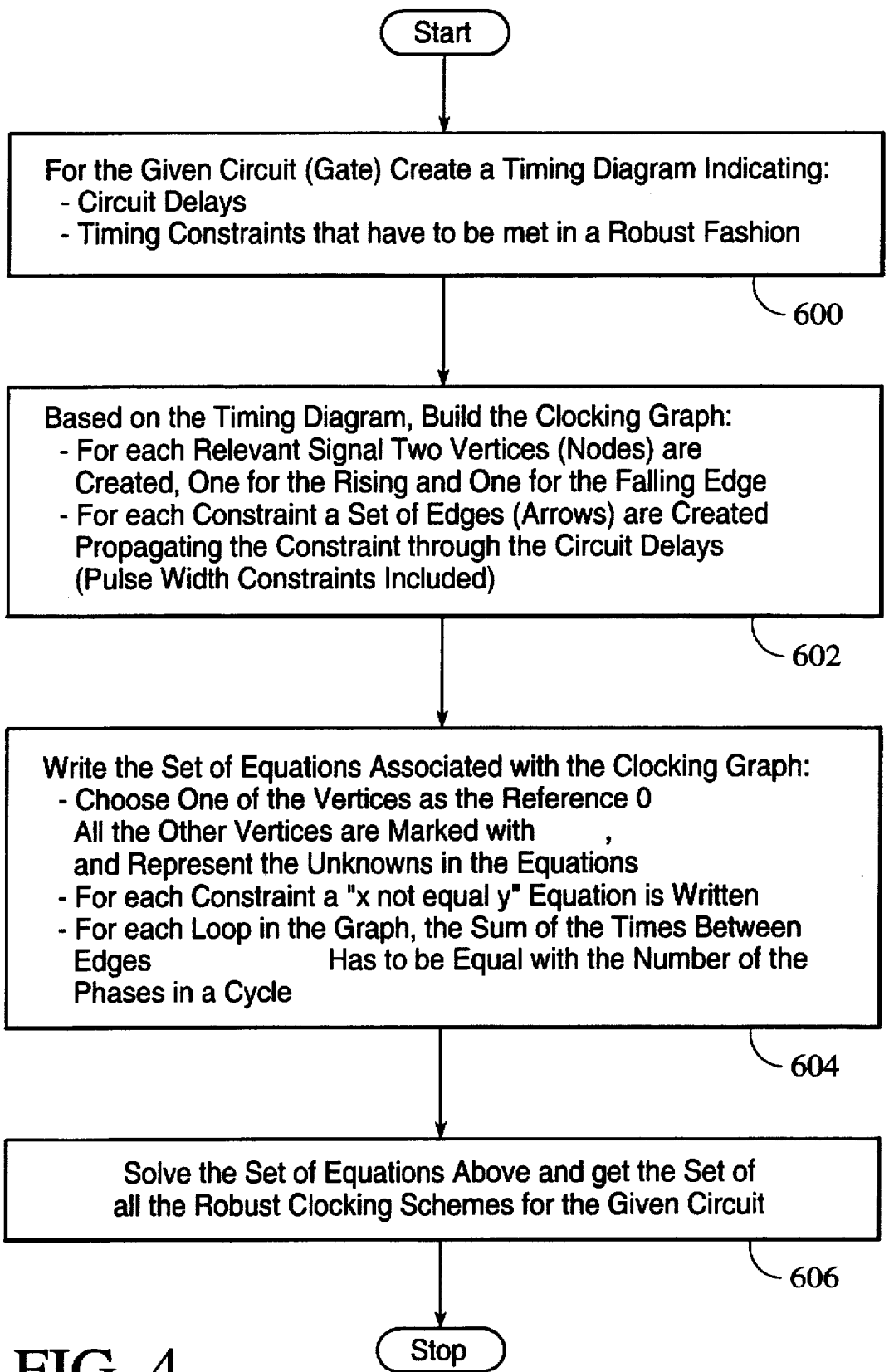
FIG. 4 is a flow diagram of a method according to the present invention for finding the robust clocking schemes in a logic circuit.

FIG. 4 is a flow diagram of a method according to the present invention. For a given circuit, a timing diagram is created via step 600. This timing diagram should indicate circuit delays and timing constraints which need to be met in a robust fashion.

Based on the timing diagram derived in step 600, a clocking graph is generated via step 602. For each relevant signal, two vertices (nodes) are generated, one vertex for the rising edge and another vertex for the falling edge. Additionally, for each constraint, a set of edges are generated propagating the constraint through the circuit delays, including pulse width constraints.

A set of equations associated with the clocking graph is then generated via step 604. One of the vertices is selected as a reference 0. All other vertices are marked with and represent the unknowns (variables such as x and y) in the equations. For each constraint, a "x≠y" equation is generated. Additionally, for each loop in the clocking graph, the sum of the times between edges are set equal to the number of phases in a cycle. Finally, the set of equations generated via step 604 is solved and all of the robust clocking schemes for the given circuit are derived via step 606.

Figure 5:
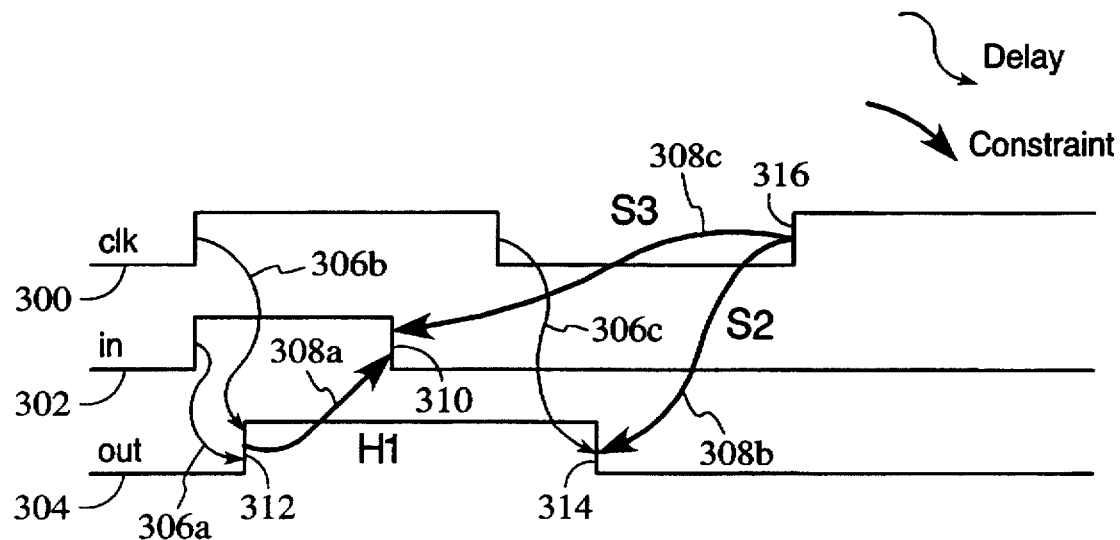
FIG. 5 is a timing diagram for the signal waveforms for the basic footed domino gate.

One example of the method according to the present invention is the method as applied to the footed domino gate shown in FIG. 2. FIG. 5 shows a timing diagram for signal waveforms for the basic footed domino gate shown in FIG. 2. FIG. 5 shows a waveform for the clock 300, a waveform for input 302, and a waveform for the output 304. Additionally, delays 306a–306c are indicated by thin arrows, while constraints of the system 308a–308c are indicated by bold arrows.

In order to have this basic footed domino circuit function properly, several constraints must be satisfied in a robust fashion. One constraint is that the falling edge 310 of input should hold over the rising edge 312 of output, as indicated by arrow 308a indicating hold by H1. This holding is to ensure that there is enough time to correctly evaluate the gate. Another constraint of the circuit is that the falling edge 314 of output should precede the next rising edge 316 of clock, as indicated by bold arrow 308b, which indicates setup S2. This constraint is to ensure that there is enough time to correctly reset the gate.

A further constraint is that the falling edge 310 of input should precede the next rising edge 316 of clock, as indicated by bold arrow 308c which indicates setup S3. This constraint is to prevent the present input from corrupting the next evaluation of the gate.

Figure 6:
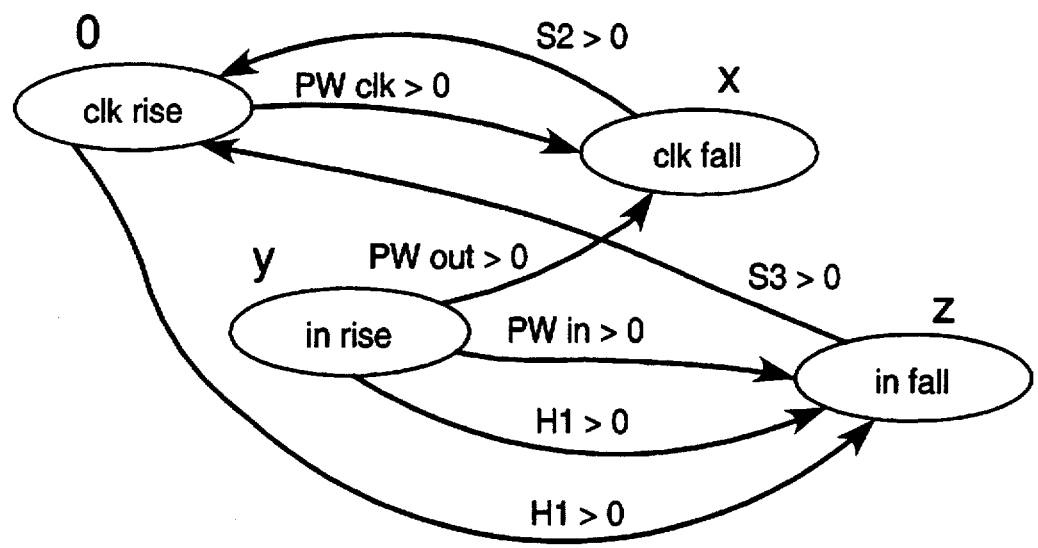
FIG. 6 is a clocking graph of the method according to the present invention corresponding to the basic footed domino gate.

For the example of the basic footed domino gate, the clocking graph of FIG. 6 is generated. The clocking graph includes a plurality of loops and vertices. An example of a loop within the clocking graph includes the arrows marked S2>0 and PW clk >0. Examples of vertices include clk rise and clk fall. In terms of the time between driving clock edges, the circuit delays count as 0. If a constraint is to be satisfied in a robust fashion, the clock edges that define it should be different. The cycle time requirement translates to the requirement that the sum of the "times between two edges" along each loop in the clocking graph of FIG. 6 should be n, for example, 4 (in general, a multiple of n, in this example, 4).

In terms of the clocking graph shown in FIG. 6, finding all of the robust clocking schemes for the footed domino gate is equivalent to finding all the triplet (x, y, z) where x, y, z are clock edges, such that: $x \neq 0$, $y \neq x$, $y \neq z$, $z \neq 0$. These equations are derived since, for any a, b, t(a,b)+t(b,a)=4, there are no non-trivial loops in the clocking graph of FIG. 6.

The solutions for (x,y,z) are (1,0,1), (1,2,1), (1,3,1), (1,0,2), (1,3,2), (1,0,3), (1,2,3), (2,0,1), (2,3,1), (2,0,2), (2,1,2), (2,3,2), (2,0,3), (2,1,3), (3,0,1), (3,2,1), (3,0,2), (3,1,2), (3,0,3), (3,1,3), (3,2,3).

This set of solutions corresponding to the clock pin having been assigned one of the clock phases that have the rising edge 0 shown in FIG. 6. There are three more sets of solutions that can be obtained by cyclic permutation of the set above. Although there are numerous methods to solve the equations, exhaustive search can be used.

Figure 7:
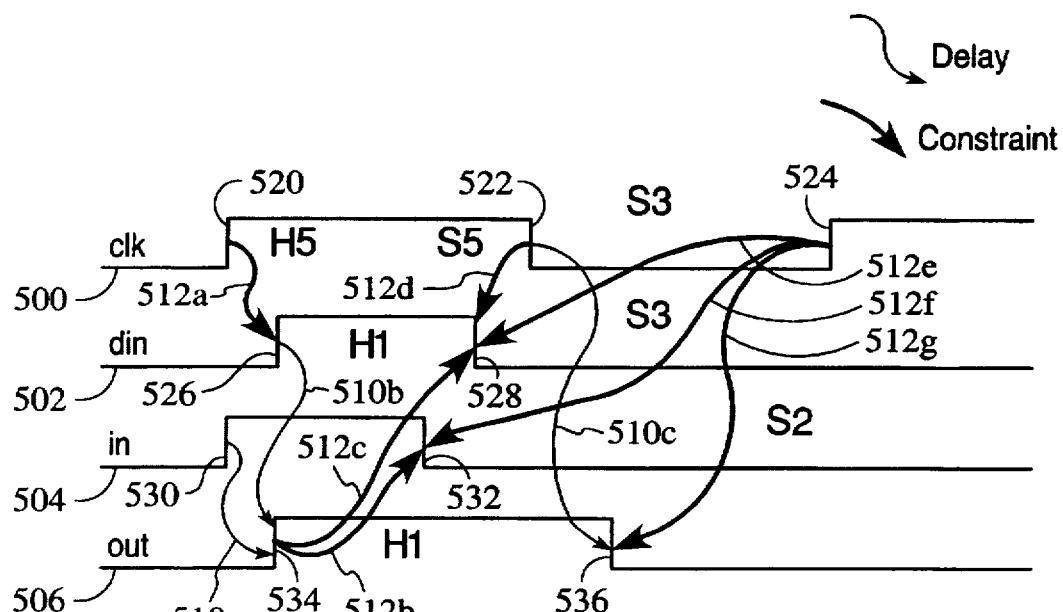
FIG. 7 is a timing diagram for the signal waveforms for the basic delayed reset domino gate.

Another example of the method according to the present invention is the method as applied to the basic delayed reset domino gate of FIG. 3. FIG. 7 is a timing diagram for signal waveforms for the basic delayed reset domino gate of FIG. 3. FIG. 7 shows a clock waveform 500, a dominant input waveform 502, an input waveform 504, and an output waveform 506. FIG. 7 also shows delays 510a–510c and constraints 512a–512g.

A set of constraints must be satisfied in a robust fashion in order to have a basic delayed reset domino gate function properly. One constraint is that the falling edge 532 of input should hold over the rising edge 534 of output, as shown by the hold H1 arrow 512b. This constraint is to ensure that there is enough time to correctly evaluate the gate.

Another constraint is that the falling edge 536 of output should precede the next rising edge 524 of clock, as indicated by the setup S2 arrow 512g. This constraint is to ensure that there is enough time to correctly reset the gate.

A further constraint is that the falling edge 532 of input should precede the next rising edge 524 of clock, as indicated by the setup S3 arrow 512f. This constraint prevents the present input from corrupting the next evaluation of the gate.

Yet another constraint is that the falling edge 328 of the dominant input should precede the falling edge 522 of clock, as indicated by arrow 512d indicating setup S5. This constraint is to prevent direct current (DC) during reset.

An additional constraint is that the rising edge 526 of the dominant input should hold over the rising edge 520 of clock, as indicated by arrow 512a indicating hold H5. This constraint is to prevent DC current during reset.

Figure 8:
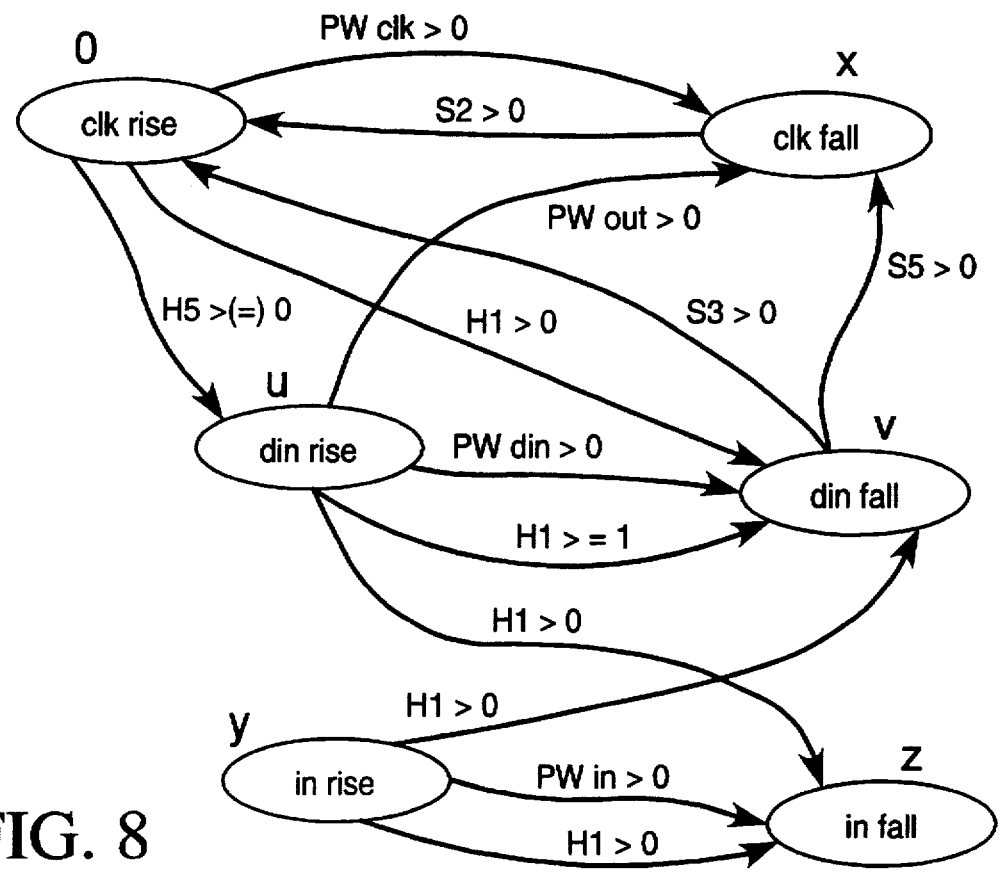
FIG. 8 is a clocking graph of the method according to the present invention corresponding to the basic delayed reset domino gate.

This example generates the clocking graph shown in FIG. 8. In terms of the clocking graph in FIG. 8, finding all the robust clocking schemes for the delayed reset domino gate is equivalent to finding all the quintuplets (u,z,x,y,z) where u,v,x,y,z are clock edges, such that:

$x \neq 0$, $u \neq 0$, $v \neq 0$, $x \neq v$, $y \neq v$, $u \neq v$, $y \neq z$, $u \neq x$, $u \neq z$ t(0,u)+t(u,v)+t(v,x)+t(x,0)=4 t(0,u)+t(u,v)+t(v,0)=4 t(0,v)+t(v,x)+t(x,0)=4 t(0,u)+t(u,x)+t(x,0)=4

Note that the loop equation t(0,u)+t(u,v)+t(v,x)+t(x,0)=4 admits the only solution u=1, v=2, x=3 that corresponds to having the C(0,3) clk and C(1,2) din. In order to get more useful solutions, the constraint H5>0 can be relaxed to H5>=0. In this case, the equations admit the following set of solutions (u,v,x,u,z): (1,2,3,0,2), (1,2,3,0,3), (1,2,3,1,2), (1,2,3,1,3), (1,2,3,3,2), (1,2,3,1,0), (1,2,3,3,0), (0,1,2,0,1), (0,1,2,0,2), (0,1,2,0,3), (0,1,2,2,1), (0,1,2,2,3), (0,1,2,3,1), (0,1,2,3,2), (0,1,3,0,1), (0,1,3,0,2), (0,1,3,0,3), (0,1,3,2,1), (0,1,3,2,3), (0,1,3,3,1), (0,1,3,3,2), (0,2,3,0,1), (0,2,3,0,2), (0,2,3,0,3), (0,2,3,1,2), (0,2,3,1,3), (0,2,3,3,1), (0,2,3,3,2).

This set of solutions corresponds to the clock pin having been assigned one of clock phases that have the rising edge 0. There are three more sets of solutions that can be obtained by cyclic permutation of the set above.

The clocking graphs of FIGS. 6 and 8 represent mathematical models of examples of the present invention. These clocking graphs indicate which of the possible phase assignments are robust.

Figure 9:
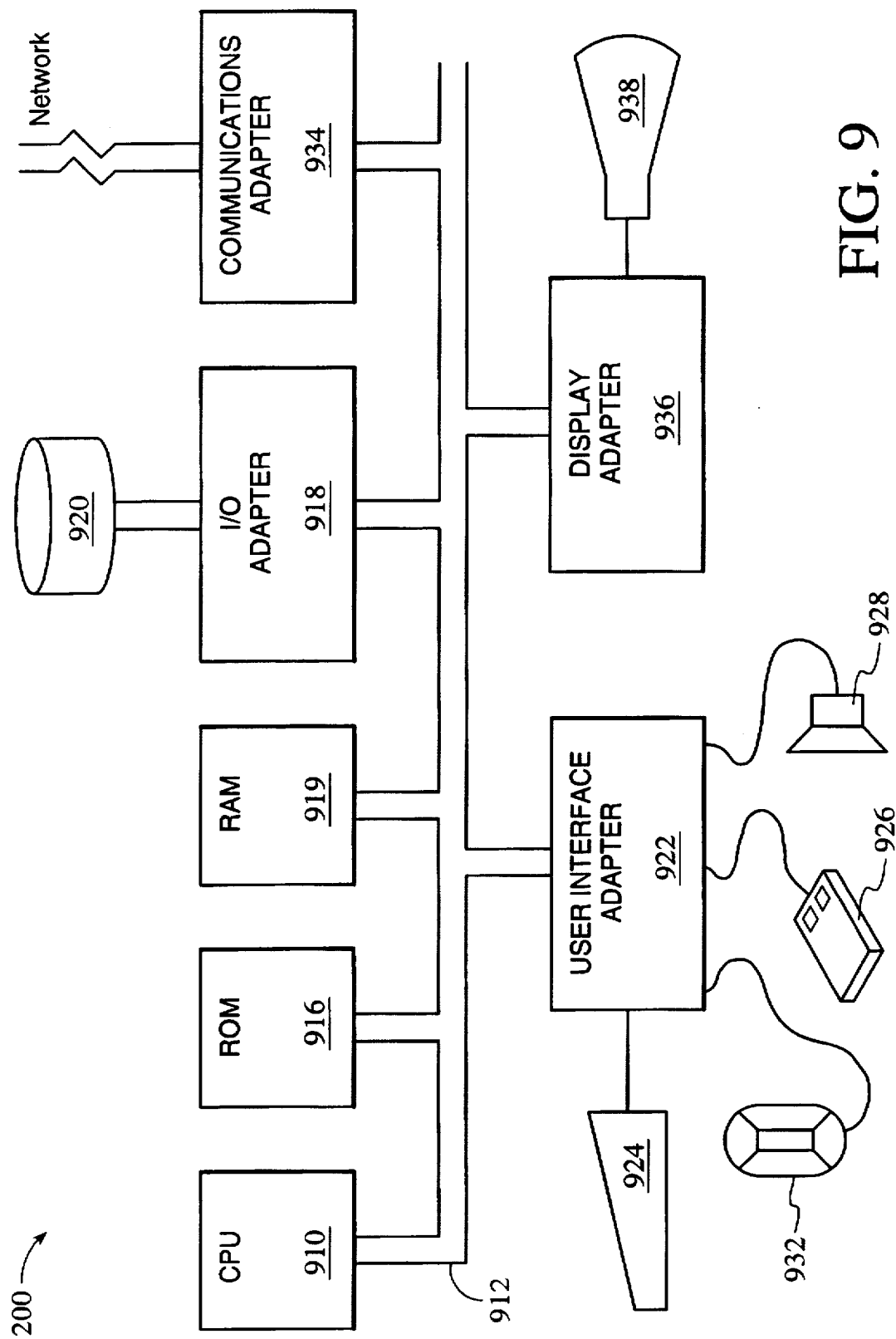
FIG. 9 is a block diagram of an example of a data processing system which may be used for the present invention.

Referring now to FIG. 9, an example is shown of a data processing system 900 which may be used for the invention. The system has a central processing unit (CPU) 910, such as a PowerPC microprocessor ("PowerPC is a trademark of IBM Corporation) according to "The PowerPC Architecture: A Specification for a New Family of RISC Processors", 2d edition, 1994, Cathy May, et al., Ed., which is hereby incorporated herein by reference. A more specific implementation of a PowerPC microprocessor is described in the "PowerPC 604 RISC Microprocessor User's Manual", 1994, IBM Corporation, which is hereby incorporated herein by reference. The history buffer (not shown) of the present invention is included in CPU 910. The CPU 910 is coupled to various other components by system bus 912. Read only memory ("ROM") 916 is coupled to the system bus 912 and includes a basic input/output system ("BIOS") that controls certain basic functions of the data processing system 900. Random access memory ("RAM") 914, I/O adapter 918, and communications adapter 934 are also coupled to the system bus 912. I/O adapter 918 may be a small computer system interface ("SCSI") adapter that communicates with a disk storage device 920. Communications adapter 934 interconnects bus 912 with an outside network enabling the data processing system to communicate with other such systems. Input/Output devices are also connected to system bus 912 via user interface adapter 922 and display adapter 936. Keyboard 924, track ball 932, mouse 926 and speaker 928 are all interconnected to bus 912 via user interface adapter 922. Display monitor 938 is connected to system bus 912 by display adapter 936. In this manner, a user is capable of inputting to the system throughout the keyboard 924, trackball 932 or mouse 926 and receiving output from the system via speaker 928 and display 938. Additionally, an operating system such as AIX ("AIX" is a trademark of the IBM corporation) is used to coordinate the functions of the various components shown in FIG. 9.

Preferred implementations of the invention include implementations as a computer system programmed to execute the method or methods described herein, and as a computer program product. According to the computer system implementation, sets of instructions for executing the method or methods are resident in the random access memory 914 of one or more computer systems configured generally as described above. Until required by the computer system, the set of instructions may be stored as a computer program product in another computer memory, for example, in disk drive 920 (which may include a removable memory such as an optical disk or floppy disk for eventual use in the disk drive 920). Further, the computer program product can also be stored at another computer and transmitted when desired to the user's work station by a network or by an external network such as the Internet. One skilled in the art would appreciate that the physical storage of the sets of instructions physically changes the medium upon which it is stored so that the medium carries computer readable information. The change may be electrical, magnetic, chemical or some other physical change. While it is convenient to describe the invention in terms of instructions, symbols, characters, or the like, the reader should remember that all of these and similar terms should be associated with the appropriate physical elements.

Note that the invention describes terms such as comparing, validating, selecting, identifying or other terms that could be associated with a human operator. However, for at least a number of the operations described herein which form part of at least one of the embodiments, no action by a human operator is desirable. Those operations described here are, in large part, machine operations processing electrical signals to generate other electrical signals.

A method for mapping all of the robust clocking schemes for a logic circuit, such as a 4(n) phase domino circuit, has been disclosed. The method of the present invention is useful in efficiently exploring the present design possibilities of a sophisticated logic circuit, such as a sophisticated domino circuit, and temporal interaction between such circuits. The present invention avoids an exhaustive search of those possibilities which would take a very long time.

Software written according to the present invention is to be stored in some form of computer-readable medium, such as memory or CD-ROM, or transmitted over a network, and executed by a processor.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope the appended claims.

What is claimed is:

1. A method for mapping a clocking scheme to determine robust clocking schemes in a logic circuit, in which the logic circuit being represented by a clocking graph, the clocking graph having at least one loop including a plurality of vertices, wherein two vertices represent each relevant signal, one for a rising edge and one for a falling edge, and wherein a plurality of constraints of the logic circuit propagate through circuit delays, the method comprising the steps of:

(a) selecting one of the vertices as a reference;

(b) assigning at least one of the plurality of vertices as an unknown;

(c) creating at least a first equation by setting the unknown as not equal to any of the other vertices for each constraint, the first equation being included in a set of equations;

(d) creating at least a second equation by setting a sum of times between edges equal to a number of phases in a cycle, the second equation representing the at least one loop in the clocking graph, wherein the second equation is also included in the set of equations; and (e) solving the set of equations to provide a set of clocking schemes.

2. The method of claim 1, wherein the at least one loop includes at least one constraint.

3. The method of claim 1, wherein all of the plurality of vertices is assigned as unknown.

4. A computer readable medium containing program instructions for mapping a clocking scheme to determine robust clocking schemes in a logic circuit, in which the logic circuit being represented by a clocking graph, the clocking graph having at least one loop including a plurality of vertices, wherein two vertices represent each relevant signal, one for a rising edge and one for a falling edge, and wherein a plurality of constraints of the logic circuit propagate through circuit delays, the program instructions comprising the steps of:

(a) selecting one of the vertices as a reference;

(b) assigning at least one of the plurality of vertices as an unknown;

(c) creating at least a first equation by setting the unknown as not equal to any of the other vertices for each constraint, the first equation being included in a set of equations;

(d) creating at least a second equation by setting a sum of times between edges equal to a number of phases in a cycle, the second equation representing the at least one loop in the clocking graph, wherein the second equation is also included in the set of equations; and (e) solving the set of equations to provide a set of clocking schemes.

5. The computer readable medium of claim 4, wherein the at least one loop includes at least one constraint.

6. The computer readable medium of claim 4, wherein all of the plurality of vertices is assigned as unknown.

7. A system for mapping a clocking scheme to determine robust clocking schemes in a logic circuit, in which the logic circuit being represented by a clocking graph, the clocking graph having at least one loop including a plurality of vertices, wherein two vertices represent each relevant signal, one for a rising edge and one for a falling edge, and wherein a plurality of constraints of the logic circuit propagate through circuit delays, the system comprising:

means for selecting one of the vertices as a reference;

means for assigning at least one of the plurality of vertices as an unknown, the assigning means being coupled to the selecting means;

means for creating at least a first equation by setting the unknown as not equal to any of the other vertices for each constraint, the first equation being included in a set of equations, the first equation creating means being coupled to the assigning means;

means for creating at least a second equation by setting a sum of times between edges equal to a number of phases in a cycle, the second equation representing the at least one loop in the clocking graph, wherein the second equation is also included in the set of equations the second equation creating means being coupled to the first equation creating means; and means for solving the set of equations to provide a set of clocking schemes, the solving means being coupled to the second equation creating means.

* * * * *